United States Patent
Uchimura et al.

(10) Patent No.: US 8,011,423 B2
(45) Date of Patent: Sep. 6, 2011

(54) HEAT SINK WITH A CENTRIFUGAL FAN HAVING VERTICALLY LAYERED FINS

(75) Inventors: Yasuhiro Uchimura, Tokyo (JP); Chiyoshi Sasaki, Tokyo (JP); Nobuyuki Hashimoto, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 11/540,626

(22) Filed: Oct. 2, 2006

(65) Prior Publication Data
US 2007/0204976 A1 Sep. 6, 2007

(30) Foreign Application Priority Data

Mar. 2, 2006 (JP) ................... 2006-056262

(51) Int. Cl.
*F28F 3/06* (2006.01)
*F28F 4/00* (2006.01)
*H05K 7/18* (2006.01)
(52) U.S. Cl. .......... 165/122; 165/80.3; 361/697
(58) Field of Classification Search .......... 165/122, 165/80.3, 104.33; 361/697
See application file for complete search history.

(56) References Cited

U.S. PATENT DOCUMENTS

| | | | |
|---|---|---|---|
| 3,592,260 | A | 7/1971 | Berger |
| 6,439,299 | B1 | 8/2002 | Miyahara et al. |
| 6,867,971 | B2 * | 3/2005 | Lai ................ 361/697 |
| 7,492,588 | B2 * | 2/2009 | Hwang et al. ........... 361/694 |
| 7,520,314 | B2 * | 4/2009 | Hwang et al. .......... 165/80.3 |
| 7,529,085 | B2 * | 5/2009 | Makley et al. ........... 710/303 |
| 2003/0007327 | A1 * | 1/2003 | Fujiwara ............ 361/697 |
| 2003/0015311 | A1 | 1/2003 | Lin et al. |
| 2003/0016495 | A1 | 1/2003 | Hongo |
| 2003/0150595 | A1 * | 8/2003 | Chen et al. ............ 165/80.3 |
| 2004/0114328 | A1 * | 6/2004 | Chiou ............. 361/697 |
| 2004/0245866 | A1 * | 12/2004 | Lopatinsky et al. ........ 310/64 |
| 2005/0252640 | A1 * | 11/2005 | Chang ............ 165/80.3 |
| 2007/0267172 | A1 * | 11/2007 | Hwang et al. ........... 165/80.3 |
| 2008/0017358 | A1 * | 1/2008 | Hwang et al. ........... 165/122 |
| 2009/0321058 | A1 * | 12/2009 | Uchimura et al. ......... 165/121 |

FOREIGN PATENT DOCUMENTS

| | | |
|---|---|---|
| CN | 2530350 Y | 1/2003 |
| JP | 9-51189 | 2/1997 |
| JP | 11-351769 | 12/1999 |
| JP | 2001-210767 | 8/2001 |
| JP | 2003-097892 | 4/2003 |

* cited by examiner

*Primary Examiner* — Cheryl J Tyler
*Assistant Examiner* — Brandon M Rosati
(74) *Attorney, Agent, or Firm* — Oblon, Spivak, McClelland, Maier & Neustadt, L.L.P.

(57) ABSTRACT

A heat sink with a centrifugal fan comprising: a cover of a prescribed shape including an air intake port and an air discharge port; a heat receiving block thermally connected to a heat generating part to be cooled; a bottom portion which is excellent in heat transferability, thermally connected to one face of said heat receiving block, and engaged to said cover to form a space portion; a heat dissipating fin portion comprising a plurality of fins, received within the space portion, thermally connected to said bottom portion, and having a prescribed shape including at least an air inflow portion; and a centrifugal fan, a rotating shaft of which is arranged in a vicinity of the air inflow portion of said heat dissipating fin portion, which intakes air from the air intake port, generates an air flow through spaces formed between adjacent fins of said heat dissipating fin portion, and generates another air flow along an inner wall of said cover toward said air discharge port.

13 Claims, 3 Drawing Sheets

HEAT SINK WITH A CENTRIFUGAL FAN HAVING VERTICALLY LAYERED FINS

BACKGROUND OF THE INVENTION

1. Field of the Invention

The present invention relates to a heat sink with a plurality of heat dissipating fins and centrifugal fan, and in particular to a compact heat sink with centrifugal fan excellent in heat transfer efficiency which has a large amount of ventilation.

2. Description of the Related Art

Since the heat density of the devices and the heat generated by the CPU, devices or the like increases, it is desired that a heat sink excellent in heat dissipating efficiency with high performance is developed. Furthermore, since the height of the electronics devices such as a personal computer, game device or the like is limited, it is desired that a compact heat sink excellent in heat dissipating efficiency with low noise is developed. A heat sink made of aluminum extruded material with low manufacturing cost has been widely used. Since the heat sink made of aluminum extruded material is manufactured as one unit in which the heat receiving block and the heat dissipating fins are integrally formed, it is easy to manufacture. However, the heat sink made of aluminum extruded material has a technical problem in which the pitch between the fins is restricted to a certain degree due to the manufacturing technology, thus fins with fine pitch are difficult to be produced.

It is difficult to satisfy the increase of the amount of the generated heat by the combination of the heat receiving block and the heat dissipating fins, resulting in the heat sink with the use of the heat pipe. The heat sink with a heat receiving block and a plurality of heat pipes is widely used in which one end of the heat pipes are attached to the heat receiving block, and a plurality of heat dissipating fins are fixed on the heat pipes in such manner that the heat pipes are vertically arranged and inserted into the heat dissipating thin fins. Heat pipes used in the above manner make the heat dissipating area to be increased, and to improve fin efficiency, enabling to dissipate a large amount of the generated heat.

The space is provided within the interior of the heat pipe which becomes a flow channel for the working fluid. The working fluid received within the space functions to cause phase transition such as vaporization, condensation or the like and movement, thus the heat is transferred. More specifically, the working fluid is vaporized in the heat absorbing side by the heat generated by the heat generating component and transferred through the material forming the heat pipe, and then the vaporized working fluid moves toward the heat dissipating side of the heat pipe. The vaporized working fluid is cooled to return to a liquid phase thereof in the heat dissipating side. Thus liquid phase working fluid circulates back to the heat absorbing side of the heat pipe. The heat is transferred by the phase transition of the working fluid and the movement.

In general, in the heat sink with a heat receiving block and a plurality of heat pipes in which one end of the heat pipes are attached to the heat receiving block, and a plurality of heat dissipating fins are fixed on the heat pipes in such manner that the heat pipes are vertically arranged and inserted into the heat dissipating thin fins, a fan is installed to the vertical side of the layered heat dissipating fins to forcefully cool the heat dissipating fins to which the heat generated by the component to be cooled is transferred through the heat pipes (refer to Japanese patent application publication No. Hei 11-351769; Japanese patent application publication No. 2001-210767).

However, the vertical side of the conventional heat sink with the cooling fan as described above has the same height as the vertically installed cooling fan, thus the height of the fan becomes high. When the above-mentioned heat sink is applied to the electronics device such as the personal computer, game device or the like, the height of which is restricted, the height of the heat dissipating fin has to be changed lower. More specifically, the heat sink having a size horizontally long is used to have a horizontally wide heat dissipating fin. In order to cool the heat sink with the thin fins of the size horizontally wide, many fans with small diameter has to be installed, thus the number of the fans becomes large to result in the large noise. Furthermore, the size of the air discharge port becomes large, leading to the large size of the box with various terminals appropriately arranged.

In addition, since many heat generating devices are installed within the box to effect the higher performance, it is necessary to more effectively lower the temperature within the box.

BRIEF SUMMARY OF THE INVENTION

One of the objects of the invention is to provide a compact heat sink with a centrifugal fan having a low sound noise and excellent in heat dissipation, which can more effectively lower the temperature within a box as a whole, even when it is used in an electronics device, the height of which is limited such as a personal computer, a game equipment or the like.

The inventors have intensively studied in order to overcome the problems in the conventional arts. As a result, it has become clear that the amount of ventilation of the air within the box is remarkably increased to more effectively lower the temperature within the box, when the shape of the heat dissipating fin portion comprising a plurality of thin fins layered with a prescribed distance is made to have a partial circular face facing the centrifugal fan, and in addition to the air flow passing through the thin fins, the air flow rapidly running along the inner wall of the cover toward the air discharge port are generated in the space portion formed by the cover and the bottom portion to which the heat dissipating fin portion is thermally connected.

More specifically, the centrifugal fan is installed within the space portion in such manner that a side of the centrifugal fan faces the partial circular face of the air inflow portion in the heat dissipating thin fins layered with a prescribed distance, and the other side of the centrifugal fan directly faces the inner wall of the cover. Thus, the air flow is generated at the side facing the inner wall of the cover by the centrifugal fan and carried along the inner wall of the cover toward the air discharge port.

The present invention is made based on the result of the study. The first embodiment of the heat sink with a centrifugal fan comprises:

a cover of a prescribed shape including an air intake port and an air discharge port;

a heat receiving block thermally connected to a heat generating part to be cooled;

a bottom portion which is excellent in heat transferability, thermally connected to one face of said heat receiving block, and engaged to said cover to form a space portion;

a heat dissipating fin portion comprising a plurality of fins, received within the space portion, thermally connected to said bottom portion, and having a prescribed shape including at least an air inflow portion; and a centrifugal fan, a rotating shaft of which is arranged in a vicinity of the air inflow portion of said heat dissipating fin portion, which intakes air from the air intake port, generates an air flow through spaces formed between adjacent fins of said heat dissipating fin portion, and generates another air flow along an inner wall of said cover toward said air discharge port.

In the second embodiment of the heat sink with a centrifugal fan of the invention, said heat dissipating fin portion has fin peripheral side portions formed by a plurality of thin fins which are layered with a prescribed clearance, said fin peripheral side portions including a partial circular face of the air inflow portion facing at least the centrifugal fan, a bent face connected to the partial circular face and extending along the inner wall of said cover, and a discharging face facing said air discharge port.

In the third embodiment of the heat sink with a centrifugal fan of the invention, said centrifugal fan is arranged in such manner that a part of an outer surface of the centrifugal fan faces the partial circular face of the air inflow portion, and a remaining part of the outer surface of the centrifugal fan faces the inner wall of the cover, and said centrifugal fan generates said another air flow which starts at a prescribed position of the inner wall of the cover and runs along the inner wall of the cover toward said air discharge port.

In the fourth embodiment of the heat sink with a centrifugal fan of the invention, said cover has a face transitional portion in a corresponding position of the inner wall to a border portion of the partial circular face of the air inflow portion and the bent face of the heat dissipating fin portion, said face transitional portion generating said another air flow along the inner wall of the cover.

In the fifth embodiment of the heat sink with a centrifugal fan of the invention, said heat dissipating fin portion further includes another fin peripheral side portion comprising a flat face directly contacting the inner wall of said cover, an end portion of said flat face being a starting point of said another air flow.

In the sixth embodiment of the heat sink with a centrifugal fan of the invention, said air discharge port is a mutual port of the air passing through the thin fins and the air running along the inner wall of the cover.

In the seventh embodiment of the heat sink with a centrifugal fan of the invention, the air discharge port of the air passing through the thin fins and the air discharge port of the air running along the inner wall of the cover are separately arranged.

In the eighth embodiment of the heat sink with a centrifugal fan of the invention, at least one heat pipe is thermally connected to said heat receiving block.

In the ninth embodiment of the heat sink with a centrifugal fan of the invention, said air discharge port is arranged in such manner that the air is discharged directly outside of a box installing the heat sink.

In the tenth embodiment of the heat sink with a centrifugal fan of the invention, the air discharge port comprises a single air discharge port.

In the eleventh embodiment of the heat sink with a centrifugal fan of the invention, a plurality of the air discharge ports are arranged therein.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 3(a) shows a cover, FIG. 3(b) shows a bottom portion excellent in heat transferability with thin fins layered with a prescribed distance thermally connected thereto, FIG. 3(c) shows a centrifugal fan;

DETAILED DESCRIPTION OF THE INVENTION

The heat sink with a centrifugal fan of the invention is described in detail with reference to the drawings.

One embodiment of the heat sink with a centrifugal fan comprises: a cover of a prescribed shape including an air intake port and an air discharge port; a heat receiving block thermally connected to a heat generating part to be cooled; a bottom portion which is excellent in heat transferability, thermally connected to one face of said heat receiving block, and engaged to said cover to form a space portion; a heat dissipating fin portion comprising a plurality of fins, received within the space portion, thermally connected to said bottom portion, and having a prescribed shape including at least an air inflow portion; and a centrifugal fan, a rotating shaft of which is arranged in a vicinity of the air inflow portion of said heat dissipating fin portion, which intakes air from the air intake port, generates an air flow through spaces formed between adjacent fins of said heat dissipating fin portion, and generates another air flow along an inner wall of said cover toward said air discharge port.

Figure 1:
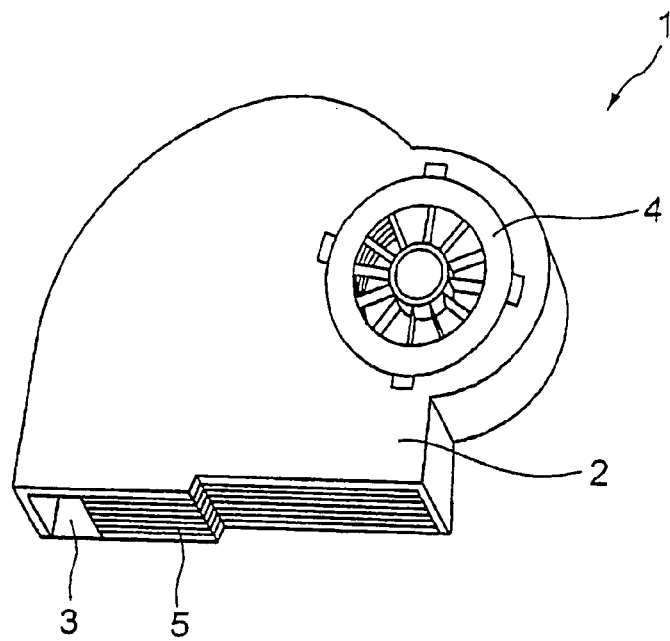
FIG. 1 is a schematic perspective view showing one embodiment of the heat sink with a centrifugal fan of the invention viewed from the front side.
Figure 2:
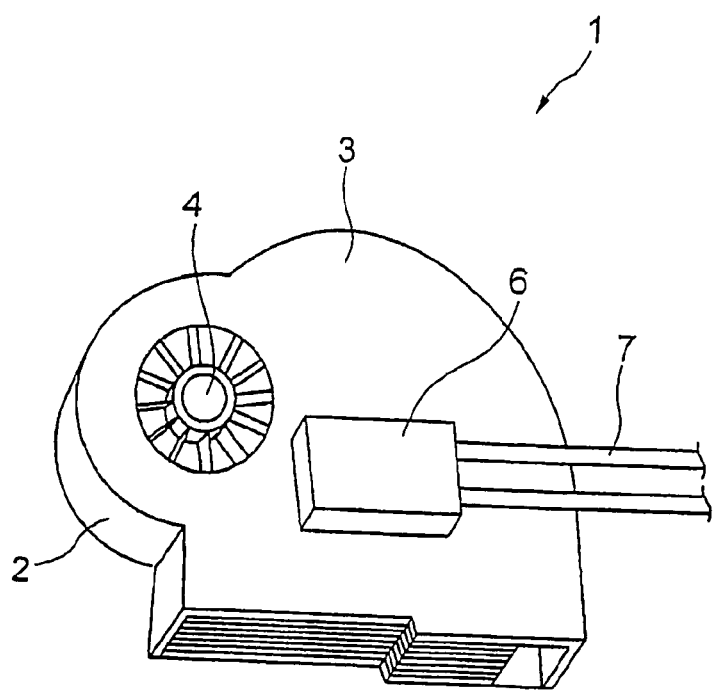
FIG. 2 is a schematic perspective view showing the embodiment of the heat sink with a centrifugal fan of the invention depicted in FIG. 1 viewed from the back side.

FIG. 1 is a schematic perspective view showing one embodiment of the heat sink with a centrifugal fan of the invention viewed from the front side. FIG. 2 is a schematic perspective view showing the embodiment of the heat sink with a centrifugal fan of the invention depicted in FIG. 1 viewed from the back side.

As shown in FIG. 1, the heat sink with a centrifugal fan 1 includes a cover 2 of a prescribed shape having an air intake port to the centrifugal fan and an air discharge port for the air passing through the heat sink, and a bottom portion 3 thermally connected to one face of the heat receiving block, and engaged to the cover to form a space portion. The centrifugal fan 4 is installed in the air intake port. The part of the thin fins 5 layered with a prescribed distance and received within the space portion can be seen in the air discharge port.

As shown in FIG. 2, the heat receiving block 6 is thermally connected to the back side of the bottom portion 3 having excellent heat transferability. A heat generating part to be cooled is thermally connected to the bottom portion. In case that the heat generating part is positioned apart from the heat sink, for example, the heat of the heat generating part is transferred to the heat receiving block 6 by a heat pipe 7. An air intake port to the centrifugal fan may be additionally arranged in the back side of the heat sink, as depicted in FIG. 2. Although a round-shaped heat pipe is shown, a plate-type heat pipe may be used, and the number of heat pipe is not limited to two.

As shown in FIGS. 1 and 2, there is provided a space in the air discharge port in which a plurality of thin fins layered with a specific distance are not positioned. As described in detail later, the air flow accelerated by the centrifugal fan passes along the inner wall of the cover through the above described space and is discharged directly out of the box, for example.

Figure 3A:
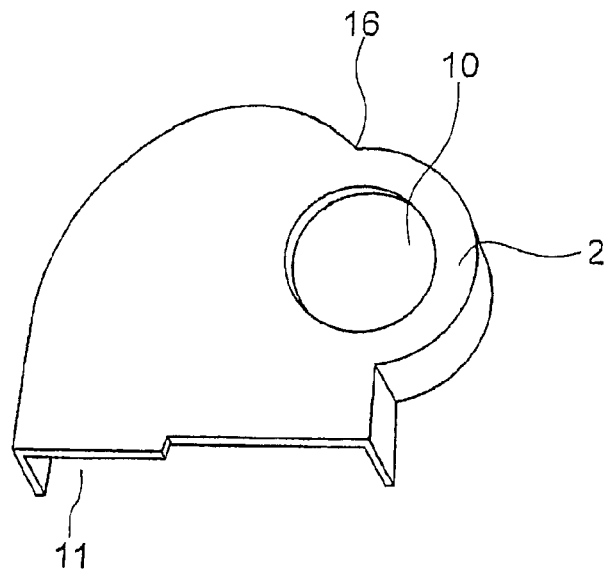
FIGS. 3(a) to 3(c) are exploded views to explain the heat sink with a centrifugal fan of the invention.
Figure 3B:
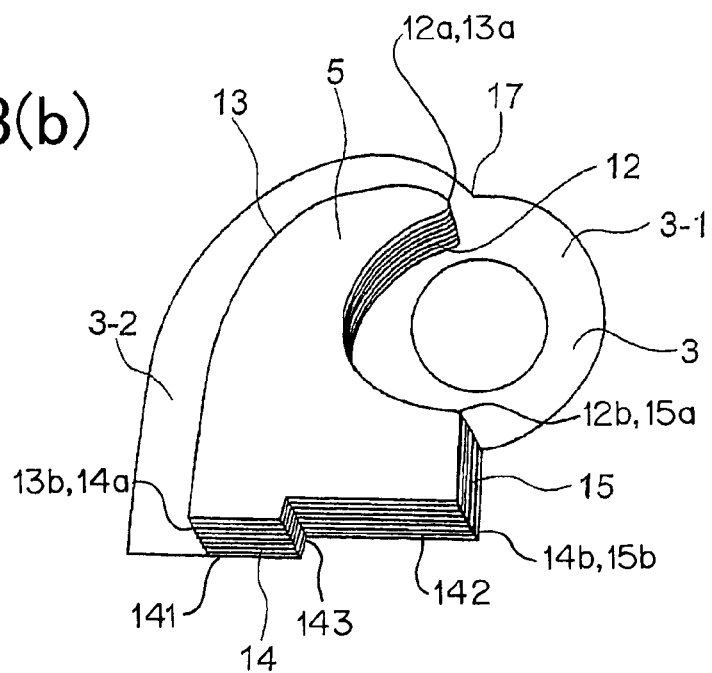
Figure 3C:
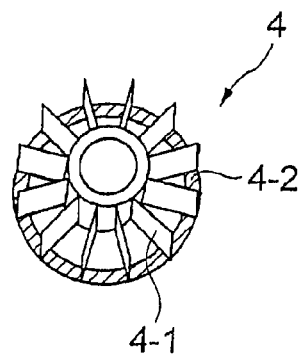

FIGS. 3(a) to 3(c) are exploded views to explain the heat sink with a centrifugal fan of the invention, FIG. 3(a) shows a cover, FIG. 3(b) shows a bottom portion excellent in heat transferability with thin fins layered with a prescribed distance thermally connected thereto, FIG. 3(c) shows a centrifugal fan.

As depicted in FIG. 3(c), the cover 2 is made of resin for example, the cover has side wall formed as one unit except the air discharge port 11. The cover has the face transitional portion 16 above the air intake port 10, at which the bent face forming the side wall of the cover drastically changes.

As depicted in FIG. 3(b), the bottom portion 3 having excellent heat transferability has a shape substantially corresponding to the cover. More specifically, the bottom portion includes a ring-like portion 3-1 on which the centrifugal fan is installed facing the partial circular face of the air inflow portion of the plurality of thin fins which are layered with a prescribed clearance, and a portion 3-2 on which the plurality of thin fins which are layered with a prescribed clearance are installed and thermally connected thereto. The bottom portion 3 having excellent heat transferability has a peripheral transitional portion 17 corresponding to the face transitional portion 16 at which the bent face forming the side wall of the cover drastically changes.

As depicted in FIG. 3(c), the centrifugal fan includes a plurality of fans (i.e., impellers) 4-1, and peripheral portion 4-2 which is fixed on the air intake port 10 of the cover 2. For example, the fans 4-1 of the centrifugal fan are inserted from outside of the cover 2, and installed on the ring-like portion 3-1, while the peripheral portion 4-2 is fixed on the cover 2 in the vicinity of the air intake port 10.

As depicted in FIG. 3(b), the heat dissipating fin portion 5 includes peripheral side portions formed by the plurality of thin fins which are layered with a prescribed clearance. More specifically, the peripheral side portions comprises a partial circular face of the air inflow portion 12 with a first end 12a and a second end 12b, a bent face 13 with a first end 13a and a second end 13b, the first end 13a of the bent face 13 connected to the first end 12a of the partial circular face 12 and the bent face extending along the inner wall of the cover to the second end 13b, and a discharging face 14 facing the air discharge part. The discharging face 14 includes a first end 14a and a second end 14b as well as a first portion 141, a second portion 142 and an intermediate portion 143 connecting the first portion 141 and the second portion 142. The second portion 142 is offset towards the fan 4. In addition, the heat dissipating fin portion 5 has another peripheral side portion 15 with a first end 15a and a second end 15b and comprising a flat face directly contacting the inner wall of the cover. The first end 15a of the side portion 15 is connected to the second end 12b of the partial circular face 12, and the second end 15b of the side portion 15 is connected to the second end 14b of the discharging face 14.

In addition to the above feature of the heat dissipating fin portion comprising the plurality of thin fins which are layered with a prescribed clearance, the heat dissipating fin portion may comprise a plurality of pin fins installed in parallel each other in an axis direction of the centrifugal fan, so as to form the same side faces as described in the above fin peripheral side portions. Respectively bent plate-shaped fins may be arranged along the air passage so that the air passes through the fins in the direction from the air inflow portion (i.e., partial circular face) to the air discharging face. Any shape may be used as the heat dissipating fin portion as far as the shape enables the air by the centrifugal fan to flow from the air inflow portion to the air discharging face.

The cover, the bottom portion and the centrifugal fan as depicted in FIGS. 3(a), 3(b), and 3(c) are combined to form the heat sink with centrifugal fan of the invention as depicted in FIGS. 1 and 2.

Figure 4:
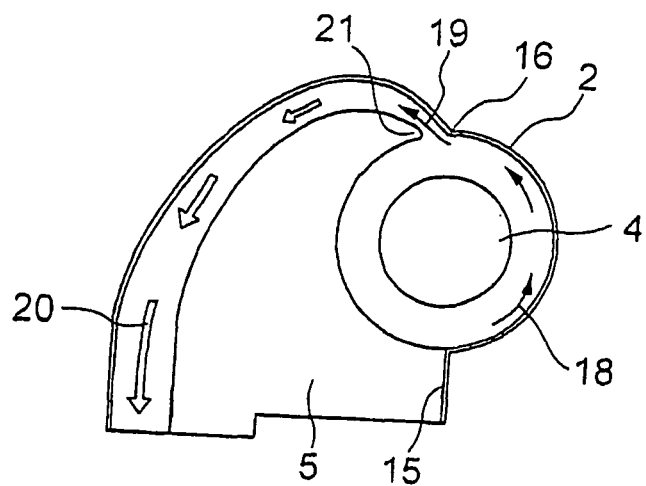
FIG. 4 is a view to explain an air flow in the heat sink with a centrifugal fan of the invention.
Figure 5:
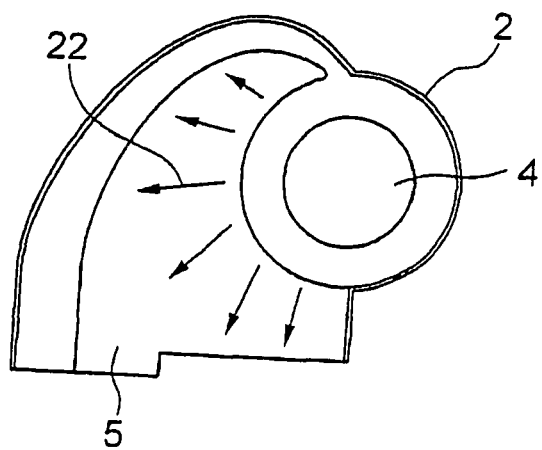
FIG. 5 is a view to explain another air flow in the heat sink with a centrifugal fan of the invention.
Figure 6:
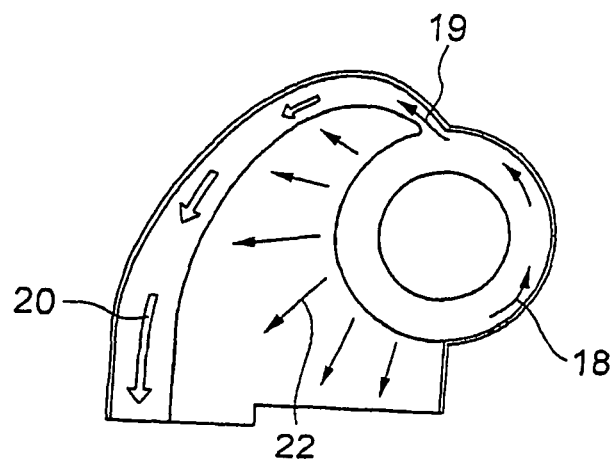
FIG. 6 is a view to explain air flows in the heat sink with a centrifugal fan of the invention.

FIGS. 4 to 6 shows air flows in the heat sink with centrifugal fan of the invention.

As shown in FIG. 4, the heat dissipating fin portion 5 is installed in a side portion of the heat sink 1 with centrifugal fan of the invention to face only one side of the centrifugal fan 4. This configuration of the heat dissipating fin portion is due to the fact that air-flow resistance becomes large to lower an amount of the air, when the heat dissipating fin portion is arranged so as to surround the centrifugal fan. Thus the conventional problem can be overcome in which the amount of air ventilation within the box is lowered to raise the surround temperature, thus raising the temperature of the devices.

More specifically, the ventilation is accelerated by two air flows in the heat sink with centrifugal fan. One of them is the air flow in which the air is caused to flow through the heat dissipating fin portion to heat-exchange with the heat dissipating thin fins to cool the air, and the other is the air flow in which the air is caused to acceleratedly run in the space portion formed by removing a part of the heat dissipating fins along the inner wall of the cover. In other words, the heat sink with centrifugal fan of the invention has a technical idea that a part of the air breathed by the centrifugal fan from the air intake port of the cover is caused to run and to be accelerated along the inner wall of the cover, and discharged directly from the air discharge port toward outside of the box.

This feature that a part of the air breathed by the centrifugal fan from the air intake port of the cover is caused to run and to be accelerated along the inner wall of the cover, and discharged directly from the air discharge port toward outside of the box enables the heat generating devices located in the vicinity of the heat sink within the box to be cooled. In other words, the heat generating devices located in the vicinity of the heat sink within the box can be cooled together with the heat generating part to be cooled.

FIG. 4 is a view to explain an air flow in the heat sink with a centrifugal fan of the invention, in which the part of the air breathed by the centrifugal fan from the air intake port of the cover is caused to run and to be accelerated along the inner wall of the cover, and discharged directly from the air discharge port toward outside of the box.

As shown in FIG. 4, the peripheral side of heat dissipating fin portion which does not face the centrifugal fan faces the inner wall of the cover as described above. Another peripheral side 15 comprising the flat face directly contact with the inner wall of the cover. Accordingly, a part of the air flow generated by the centrifugal fan flows along the inner wall of the partial circular face of the cover as denoted by the arrow 18, and then accelerated by the face transitional portion 16 at which the bent face forming the inner wall of the cover is drastically changed as denoted by the arrow 19 to form a large air flow. Thus accelerated large air flow runs toward the air discharge port, and directly discharged out of the box from the air discharge port.

The shape of the face transitional portion at which the bent face forming the inner wall of the cover changes is preferably to be hydrodynamically designed to cause the air flow to become a large accelerated flow, together with the shape of the border portion 21 of the peripheral side of the heat dissipating fin portion which is connected to the partial circular face of the air inflow portion and extended along the inner wall of the cover.

FIG. 5 is a view to explain another air flow in the heat sink with a centrifugal fan of the invention, in which the air flow passes through the heat dissipating fin portion facing the centrifugal fan. The air breathed by the centrifugal fan from the air intake port of the cover and runs toward the partial circular face of the air inflow portion is caused to radially pass through the heat dissipating thin fins as denoted by the arrow 22. The air flow as denoted by the arrow 22 changes direction and slowly flows toward the air discharge port. For example, the heat of the heat generating part is transferred by the heat pipe 7 to the heat receiving block 6, and then to the heat dissipating thin fins. The above-mentioned air flow passes through the heat dissipating thin fins and transfers the heat toward the air discharge port and discharges out of the box.

FIG. 6 is a view to explain air flows in the heat sink with a centrifugal fan of the invention. As shown in FIG. 6, two air flows are generated, one of which is explained with reference to FIG. 4 that the air flow is caused to run and to be accelerated along the inner wall of the cover, and discharged directly from the air discharge port toward outside of the box, and the other of which is explained with reference to FIG. 5 that the air flow is caused to radially pass through the heat dissipating thin fins and transfers the heat from the heat generating part through the heat receiving block 6 toward the air discharge port and discharges out of the box. Thus, the heat of the heat generating part thermally connected to the heat receiving block, as well as the heat generating devices located in the vicinity of the heat sink can be effectively discharged out of the box.

The heat receiving block 2 is made of metal material having excellent heat transferability such as aluminum, copper or the like. The shape of the heat receiving block can be appropriately selected from cylindrical column, square pillar, polygonal pillar or the like in correspondence to the shape of the heat generating device. When the heat receiving block is connected to a plurality of heat generating devices having different heights, a recess portion or protruding portion may be formed on the heat receiving face thereof.

As described above, a corresponding groove portion may be formed in the heat receiving block to the heat pipe to expand the contact area therebetween in order to facilitate thermal connection between the heat receiving block and the heat pipe, thus improving heat transferability. The round type heat pipe is preferable although not limited thereto.

According to the heat sink with centrifugal fan of the invention, the centrifugal fan is arranged in such manner that one side of the centrifugal fan faces the partial circular face of the air inflow portion in the plurality of thin fins layered with a prescribed clearance, the other side of the centrifugal fan directly faces the inner wall of the cover. Due to the above feature of the invention, the air flows through the plurality of thin fins layered with a prescribed clearance toward the air discharge port, while another air flow is generated in the side facing the inner wall by the centrifugal fan along the inner wall of the cover toward the air discharge port. The air flow along the inner wall is preferably accelerated.

More specifically, the heat transferred from the heat generating device to the heat receiving block is transferred to the plurality of thin fins layered with a prescribed clearance, and the heat transferred to the plurality of thin fins is moved by the air flow through the air intake portion toward the air discharge port by the centrifugal fan, and then discharged out of the box. In addition to the above, accelerated air flow is generated along the inner wall of the cover toward the air discharge port by the centrifugal fan in the side directly facing the inner wall of the cover. The air within the box is breathed into the heat sink by the centrifugal fan and discharged out of the box from the air discharge port by the accelerated air flow along the inner wall of the cover. Thus, since the air within the box is directly discharged out of the box by the accelerated air flow, the amount of ventilation is increased to lower the temperature raise of the total air within the box due to the heat generated by the heat generating devices.

The present invention is not limited to the above described embodiments, and various variations and modifications may be possible without departing from the scope of the present invention.

This application is based on the Japanese Patent application No. 2006-56262 filed on Mar. 2, 2006, entire content of which is expressly incorporated by reference herein.

What is claimed is:

1. A heat sink with a centrifugal fan comprising:
a cover of a prescribed shape including an air intake port, an air discharge port, and a partial circular part;
a heat receiving block thermally connected to a heat generating part to be cooled;
a heat conductive bottom portion, thermally connected to one face of said heat receiving block, and engaged to said cover with a space portion disposed therebetween;
a heat dissipating fin portion comprising a plurality of vertically layered thin fins, received within the space portion, thermally connected to said bottom portion, and including a prescribed shape including at least an air inflow portion;
an outward air flow passage disposed within the space portion between an inner wall of the partial circular part and peripheral end portions of the vertically layered thin fins of the heat dissipating fin portion; and
a centrifugal fan, a rotating shaft of which is arranged in a vicinity of the air inflow portion of said heat dissipating fin portion, said centrifugal fan intakes air from the air intake port, generates a first outward air flow through spaces disposed between adjacent layered fins of said heat dissipating fin portion, and generates a second outward air flow in said outward air flow passage along an inner wall of said cover toward said air discharge port,
wherein said heat dissipating fin portion includes fin peripheral side portions formed by a plurality of thin fins which are layered with a prescribed clearance, said fin peripheral side portions including a partial circular face of the air inflow portion facing at least the centrifugal fan with a first end and a second end, a bent face, with a first end and a second end, the first end of the bent face is connected to and coincident with the first end of the partial circular face, the bent face extending along the inner wall of said cover and follows a contour of the inner wall of said cover, a side flat face, with a first end and a second end, the first end of the side flat face is connected to and coincident with the second end of the partial circular face, the side flat face directly contacting the inner wall of the cover, and a discharging face with a first end and a second end, the first end of the discharging face is connected to and coincident with the second end of the bent face and the second end of the discharging face is connected to and coincident with the second end of the side flat face, the discharging face facing the air discharge port and including a first portion, a second portion, and an intermediate portion connecting the first portion and the second portion, the intermediate portion extending substantially parallel to the side flat face such that the second portion is offset towards the centrifugal fan, wherein said centrifugal fan is arranged in such manner that a part of an outer surface of the centrifugal fan is adjacent to the partial circular face of the air inflow portion, and a remaining part of the outer surface of the centrifugal fan is adjacent to the inner wall of the cover, and said centrifugal fan generates said second outward air flow in said air flow passage which starts at a prescribed position of the inner wall of the cover and runs along the inner wall of the cover toward said air discharge port, wherein said cover includes a face transitional portion in a position of the inner wall corresponding to a border portion of the partial circular face of the air inflow portion and the bent face of the heat dissipating fin portion, said face transitional portion generates said second outward air flow along the inner wall of the cover, wherein said second outward air flow widens gradually from said face transition portion toward said air discharge port, wherein said second outward air flow is accelerated by a multiplier effect of said face transitional portion and said gradually widening second outward air flow from said face transition portion toward said air discharge port, such that said second outward air flow has a greater velocity than said first outward air flow, wherein a portion of the air flow generated by the centrifugal fan flows in a semi-circular manner along the inner wall of the partial circular face of the cover and is then accelerated by the face transitional portion through a channel defined by the bent face and the inner wall of the cover to generate said outward air flow, and wherein said first outward air flow and said second outward air flow are joined together at the air discharge port.

2. The heat sink with a centrifugal fan as claimed in claim 1, wherein said air discharge port is a mutual port of the air passing through the thin fins and the air running along the inner wall of the cover.

3. The heat sink with a centrifugal fan as claimed in claim 1, wherein the air discharge port of the air passing through the thin fins and the air discharge port of the air running along the inner wall of the cover are separately arranged.

4. The heat sink with a centrifugal fan as claimed in claim 2, wherein at least one heat pipe is thermally connected to said heat receiving block.

5. The heat sink with a centrifugal fan as claimed in claim 4, wherein said air discharge port is arranged in such manner that the air is discharged directly outside of a box in which the heat sink is installed.

6. The heat sink with a centrifugal fan as claimed in claim 2, wherein the air discharge port comprises a single air discharge port.

7. The heat sink with a centrifugal fan as claimed in claim 3, wherein a plurality of the air discharge ports are arranged therein.

8. The heat sink with a centrifugal fan as claimed in claim 3, wherein at least one heat pipe is thermally connected to said heat receiving block.

9. The heat sink with a centrifugal fan as claimed in claim 1, wherein a recess portion is disposed on the heat receiving face of the heat receiving block.

10. The heat sink with a centrifugal fan as claimed in claim 1, wherein a protruding portion is formed on the heat receiving face of the heat receiving block.

11. The heat sink with a centrifugal fan as claimed in claim 1, wherein the heat receiving block is made of metal.

12. The heat sink with a centrifugal fan as claimed in claim 11, wherein the heat receiving block is made of aluminum.

13. The heat sink with a centrifugal fan as claimed in claim 11, wherein the heat receiving block is made of copper.

* * * * *